US006172902B1

(12) United States Patent
Wegrowe et al.

(10) Patent No.: US 6,172,902 B1
(45) Date of Patent: Jan. 9, 2001

(54) NON-VOLATILE MAGNETIC RANDOM ACCESS MEMORY

(75) Inventors: Jean-Eric Wegrowe, Lausanne; Jean-Philippe Ansermet, Morges; Scott E. Gilbert, Cherrex, all of (CH)

(73) Assignee: Ecole Polytechnique Federale de Lausanne (EPFL), Lausanne (CH)

( * ) Notice: Under 35 U.S.C. 154(b), the term of this patent shall be extended for 0 days.

(21) Appl. No.: 09/376,714

(22) Filed: Aug. 13, 1999

(30) Foreign Application Priority Data

Aug. 12, 1998 (WO) .................................. PCT/IB98/01247

(51) Int. Cl.[7] .................................................... G11C 11/15
(52) U.S. Cl. .......................... 365/158; 365/129; 365/171
(58) Field of Search ................................... 365/158, 129, 365/171, 159

(56) References Cited

U.S. PATENT DOCUMENTS

| | | | |
|---|---|---|---|
| 5,237,529 | * 8/1993 | Spitzer | 365/158 |
| 5,477,482 | * 12/1995 | Prinz | 365/129 |
| 5,774,394 | * 6/1998 | Chen et al. | 365/158 |
| 5,902,690 | * 5/1999 | Tracy et al. | 428/693 |
| 5,956,267 | * 9/1999 | Hurst et al. | 365/158 |
| 5,991,193 | * 11/1999 | Gallagher et al. | 365/171 |
| 6,016,269 | * 1/2000 | Peterson et al. | 365/171 |

OTHER PUBLICATIONS

Z. Wang, Y. Nakamura, J. of Magnetism and Magnetic Materials 159 (1996), 233; p. 1, lines 14–16.
L.V. Melo et al. (IEEE Trans. on Magnetics 33(1997); p. 2, lines 17–18.
"A New Method to Construct Nanostructured Materials of Controlled Morphology", B. Doudin, J.–Ph. Ansermet, Nanostructured Materials, vol. 6, 521–524 (1995); p. 3, lines 21–23.

J. Shen "Logic Devices and Circuit Based on Giant Magnetoresistance", IEEE Trans. Mag. 33 (1997), 4492; p. 12, line 12.
"Anisotropic Magnetoresistance as a Probe of Magnetization Reversal in Individual Nanosized Nickel Wires" J.–E. Wegrowe, S.E. Gilbert, D. Kelly, B. Doudin, J.–Ph. Ansermet, IEEE Trans. Mag. 34 (1998), 903; p. 12, line 34; p. 13, line 2 and p. 14, lines 28–31.
"Magnetic and Transport Properties of Electrodeposited Nanostructured Nanowires", B. Doudin, J.–E. Wegrowe, S.E. Gilbert, V. Scarani, D. Kelly, J.P. Meier, J.–Ph. Ansermet, IEEE Trans. Mag. 34 (1998), 968; p. 13, lines 5–9.
"Current–Induced Switching of Domains in Magnetic Multi Layer Devices", E.B. Myers et al, Science, vol. 28, Aug. 6, 1999.

* cited by examiner

Primary Examiner—Viet Q. Nguyen
(74) Attorney, Agent, or Firm—Henderson & Sturm LLP (57) ABSTRACT

A non-volatile random access memory (NVRAM) of the type with magnetoresistive memory elements (1) connected by sets of non-intersecting conductor sense lines (3, 4) which define the address of each memory element (1) and are connectable to a magnetic write/read recording unit. The memory elements are a plurality of magnetoresistive submicron dots or wires (1) embedded in a membrane (2) through which the submicron dots or wires extend. The sets of non-intersecting conductor sense lines (3, 4) are connected to the opposite ends of the submicron dots or wires (1) on opposite sides of the membrane. Each magnetoresistive submicron dot or wire (1) is composed of ferromagnetic material or a combination of ferromagnetic and non-ferromagnetic materials having at least two magnetic states ("0"; "1"), writeable by passing at an appropriate external field a writing current pulse ($i_w$) in its conductor lines (3, 4, 5) sufficient to switch its magnetic states and readable by passing a an AC or DC current ($i_r$) in its conductor lines below the level for switching its magnetic states.

12 Claims, 6 Drawing Sheets

NON-VOLATILE MAGNETIC RANDOM ACCESS MEMORY

FIELD OF THE INVENTION

This invention relates to non-volatile high density magnetic random access memory (NVMRAM) storage devices. The invention is more particularly concerned with computer memory, smart cards and other applications of embedded memory, microprocessor controllers, sensors, etc. The invention provides an improved NVRAM with high areal density as well as methods for its manufacture and for writing and reading data therein, and data storage devices incorporating the NVMRAM associated or not with a magnetic write/read recording unit.

BACKGROUND ART

Usual magnetoresistive memory devices (see e.g. Z. Wang, Y. Nakamura, J. of Magnetism and Magnetic Materials 159(1996), 233) such as the GMR memory cell are composed of at least two ferromagnetic layers separated by a non-ferromagnetic layer. For the writing procedure each cell has a word line. By applying a current to the word line, the magnetization of the upper layer can be switched by the induced magnetic field. In order to keep the bottom layer pinned in a given direction, an intermediate non-ferromagnetic layer is inserted between the two ferromagnetic layers allowing magnetic exchange coupling to be avoided. The two magnetic configurations, corresponding to the binary information "1" or "0", are "1" when both layers are parallel and "0" when the layers are antiparallel. In addition to the word line, for writing, a separate sense line contacting the layers is provided in order to read the magnetic configuration, "1" (parallel=low resistivity) or "0" (antiparallel=high resistivity).

In such known devices, the write and read currents flow in separate word and sense lines, leading to constraints in the architecture, which must be adapted to the structure of the recording unit or logical processing (address of the memory cell, amplification, drivers, etc.), and necessitating also a high word current. Moreover, such known structures are difficult to scale down.

In order to avoid the presence of two line nets (word line and sense line) and to simplify the memory cell architecture, some alternative solutions have been proposed.

One example is a multilayer device described in U.S. Pat. No. 5,695,864, which avoids the need to induce a local field by the word line. This device has a special multilayer configuration and requires a special write stylus.

A second example is a specific spin-valve memory architecture proposed by L. V. Melo et al. (IEEE Trans. on Magnetics 33(1997), 3295) wherein memory bits each made of a spin-valve sandwich stripe are arranged in a matrix. Each bit is addressed with column and row contacts which are connected as a single line via the spin-valve stripe, making a separate word line unnecessary. However, this proposal relates solely to a four-layer system with a specific spin-valve architecture wherein information is stored in a pinned layer perpendicular to the current in the strip. A "1" or "0" is written depending on the direction of the current. With this geometry, demagnetizing fields and high writing currents (of the order of 20 mA) have to be taken into account when scaling down in dimensions. Given that a typical spin-valve stripe measures 4 $\mu$m×1 $\mu$m, there is no prospect of scaling down by several orders of magnitude to achieve a very high areal density.

SUMMARY OF THE INVENTION

The invention aims to provide a non-volatile high density magnetic random access memory storage device incorporating memory cells of deep sub-micron dimensions permitting a very high areal density storage, using a single electric line per bit (or memory cell), operating with a weak electric current amplitude and without the need of particular architecture for the induction of a local field (i.e. without a separate word line), and which allows mass production. Moreover, in contrast to the known devices which are confined to a specific geometry and architecture, the invention aims to provide a non-volatile random access memory storage device that can be integrated in different types of conventional RAM structures and logic silicon-based integrated circuit technology.

The invention is directed to magnetoresistive memory devices using "deep" sub-micron wires termed "nanowires". Nanowires are characterized by the nanometer size of the wire diameter and a micrometer scale in length. The technique of electrodeposition in track-etched membrane templates allows the mass production of arrays of $10^6$ to $10^8$ parallel nanowires per $cm^2$ (up to some Gbit/Inch$^2$) of 6000 nm length and down to 10 nm diameter ("A New Method to Construct Nanostructured Materials of Controlled Morphology", B. Doudin, J.-Ph. Ansermet, *Nanostructured Materials*, vol. 6, 521–524 (1995)). Nanowires can also be produced by microlithography or by a combination of techniques.

To date nanowire technology has been the subject of much fundamental research and there have been proposals for use as optical filters, but no practical applications have yet been developed.

The invention is based on the insight that a single nanowire of ferromagnetic or ferromagnetic/normal-metal multilayers or ferromagnetic/junction/ferromagnetic with a contact on the top and on the bottom can be used as a non-volatile memory cell unit. Two well defined magnetic states can be differentiated in the nanowire and read-out non-destructively with a low electric current. Moreover, the magnetic state can be changed by the action of a pulsed current.

The invention makes use of an array of nanowires (or dots) deposited in a membrane by electrodeposition and/or vacuum deposition and/or lithographic techniques, in order to exploit both the simplification of the structure of the basic memory cell and the intrinsic magnetic and mechanical properties.

The invention concerns a non-volatile random access memory (NVRAM) of the type comprising a plurality of magnetoresistive memory elements connected by sets of non-intersecting conductor sense lines. These non-intersecting conductor sense lines define the address of each memory element and are connectable to a magnetic write/read recording unit for writing and reading the magnetic state ("0", "1") of each memory element by passing current in its conductor sense lines.

According to the invention, the memory elements are a plurality of magnetoresistive submicron dots or wires embedded in a membrane of electrically non-conductive material through which the submicron dots or wires extend. The sets of non-intersecting conductor sense lines are connected to the opposite ends of the submicron dots or wires on opposite sides of the membrane. Each magnetoresistive submicron dot or wire is composed of ferromagnetic material or a combination of ferromagnetic and non-ferromagnetic material having at least two magnetic states ("0"; "1"), writeable by passing a writing current pulse in its conductor lines sufficient to switch its magnetic states and readable by passing a current in its conductor lines below the level for switching its magnetic states. For writing and/or reading an appropriate external magnetic field is applied.

In the NVRAM of the invention, magnetoresistive effects of nanowires and dots are used for reading a binary magnetic state and pulsed electric current is used for writing by modifying the magnetic state, thereby avoiding the need to use a multilayered structure and avoiding constraints in the geometry adapted for the induction of a local magnetic field. Both reading and writing processes are performed by using the same electric line, simplifying the architecture.

The submicron dot or wire is usually made of ferromagnetic material, of ferromagnetic/non-ferromagnetic or metal/ferromagnetic multilayers or a ferromagnetic/dielectric/ferromagnetic junction having the required magnetoresistive properties.

Preferably the submicron dots or wires—which constitute the magnetic unit—have a diameter ranging from 10 to 100 nm and a length from 200 to 10,000 nm. For a wire diameter of about 80 nm, the spacing between the dots or wires (i.e. the spacing of the conductor sense lines) could be about 150 to 250 nm. With a spacing of about 200 nm, the density of wires/dots is about $2.10^9/cm^2$. The maximum density of wires/dots of diameter 10 nm, which corresponds to a spacing of about 50 nm, is about $4.10^{10}/cm^2$.

The top and/or bottom end of the submicron dot or wire can be connected to a conductor pad or contact applied onto the respective side of the membrane. This pad or contact, which is connected to the respective conductor sense lines, is wider than the diameter of the dot or wire but less than the spacing of the conductor sense lines. Such conductor pad or contact may serve as an electrode for growth of the submicron dot or wire by electrodeposition.

The width of the sense lines is conveniently about equal to the diameter of the wires/dots or of their conductor pads or contacts. However, the sense lines can be wider or narrower, as convenient.

Depending on the type of membrane and the method of production, the membrane surface area can have up to about $10^{10}$ pores per $cm^2$. Each of these pores can receive a nanowire or dot by electrodeposition or by lithography or vacuum deposition techniques.

The geometry according to the invention permits the optimization of both the high density and the magnetic and mechanical advantages of the micrometer scale in the length direction. Furthermore, complex structures needed for recording processing and inspired from silicon-based integrated circuit technology (address of the memory cell, amplification of the signal, reference signal, etc.) can be realized on the top and/or on the bottom of the membrane.

Additional structure for storage processing, like capacitors or transistors can be added to the memory cell as patterned films in the top and the bottom of the membrane, possibly also using silicon-based integrated circuit technology.

The invention thus provides basic non-volatile random access memory structure with a large liberty for adapting conventional recording structures inspired by silicon-based integrated circuit technology.

The non-volatile random access memory according to the invention provides an ultra-high areal density, ultra-high operating speed and low power dissipation. Furthermore it provides radiation hardness.

In a specific embodiment, called the exchange-bias configuration, a ferromagnetic or anti-ferromagnetic layer is provided on the top or bottom of the membrane in contact with the dot or wire deposited in the pores, in order to induce a bias exchange field for switching the magnetic memory element form "0" to "1" with a weak applied field.

In another specific embodiment, called the spin-polarization configuration, a ferromagnetic layer is deposited on the top or bottom of the membrane, separated from the dot or wire deposited in the pores by a relatively thin layer of non-ferromagnetic material, in order to polarize the conduction electrons hence enabling amplification of the action of the writing current on the magnetic state.

Further features of the non-volatile random access memory according to the invention are set out in the claims and in the following description.

The non-volatile random access memory according to the invention can be mass produced at low cost using an electrodeposited track-etched membrane template array of nanowires, for instance a track-etched polymer membrane template, or a porous aluminum oxide membrane template, both of which contain pores, and which may subsequently be bonded to a silicon wafer substrate, the latter having been processed to include integrated circuitry for conditioning and amplifying the corresponding read and write signals.

The membrane may instead be integral with a silicon wafer substrate including integrated circuitry for processing (amplifying etc.) the reading and writing currents.

Membranes can thus be obtained by etching of, or laying on, rigid substrates, allowing the addition of transistors or capacitors per nanowire using e.g. silicon-based integrated circuit technology.

In one example of the manufacturing process, the membrane template is covered with a photoresist or electron beam resist which then is subsequently structured by photolithographic or electron beam lithographic techniques to produce a memory array having a predefined pattern of apertures to expose the underlying template at locations that are in registration with subsequent evaporation or sputter mask conductor patterns. These apertures are etched holes in the resist that range from 0.1 micron to 10 micron in diameter. Each aperture will correspond to one memory unit in the finished memory.

Gold or other suitable metal line and contact pad conductors can then be patterned on the top surface of the photoresist through evaporation or sputtering of the metal through a shadow mask to form the thin film conductor pattern which will communicate with the memory units of the memory array. These conductors provide electrical contact and serve as sense electrodes for detection of single nanowire contact events as described below, and by which the said nanowire is permanently attached and bonded to the sense electrode. During use of the memory, the sense electrode serves as the read/write line in an integrated memory element unit formed in a single step and at each location in the memory array.

Nickel or other ferromagnetic elements or alloys known to possess adequate magnetoresistive characteristics are electrodeposited into the pores of the template at each predefined node. Typical metals used are nickel, cobalt, iron and multilayers of nickel, cobalt and/or iron possibly with further metals like copper, aluminium and chromium.

The electrochemical growth of the memory elements at each location in the memory array is individually controlled by the in-situ monitoring technique described below. Within each location, electrochemical growth of nanowires can occur in any or all of up to several hundred pores of the membrane corresponding to the location. However, due to the random distribution of growth rates of nanowires in each individual pore, the in-situ monitoring technique terminates the growth in an individual location when contact made to the sense electrodes by the fastest growing nanowire is detected, hence immediately forming the integrated memory element unit as described above.

The membrane template advantageously consists of porous silicon formed by controlled anodization of the same silicon wafer as the substrate. Such porous silicon template may have a random pore distribution or a predefined distribution of pores.

In the case of a random pore distribution, the memory array can be formed by application of photoresist to the top of the template, and patterning by photo- or electron beam lithographic techniques to produce precisely positioned apertures/locations as just described. Conductor patterns may also be applied.

In the case of a predefined pore distribution in the silicon wafer, the pores may be in registration with shadow mask conductor patterns, thus permitting the evaporation or sputtering of thin film metal conductor lines and contact pads directly to the substrate without the intervention of a photo- or electron beam resist.

Nickel or other ferromagnetic elements or alloys known to possess adequate magnetoresistive characteristics are electrodeposited into the apertures of the template at each predefined location. The electrochemical growth and formation of memory element units is as described above.

Another aspect of the invention is a method of changing the magnetic state of a non-volatile random access memory according to the invention by applying a pulsed current for the writing procedure, to change the magnetic state of each memory elements comprising a submicron dot or wire, whereas reading involves passing a lower AC or DC current to determine the resistance of the memory elements, hence their magnetic state.

The invention also covers data storage devices comprising the improved non-volatile random access memory, associated or not with a magnetic write/read recording unit, including RAM chips for computer memory, smart cards, digital cameras, magnetic, optomagnetic and piezo-electromagnetic sensors.

DETAILED DESCRIPTION

Figure 1:
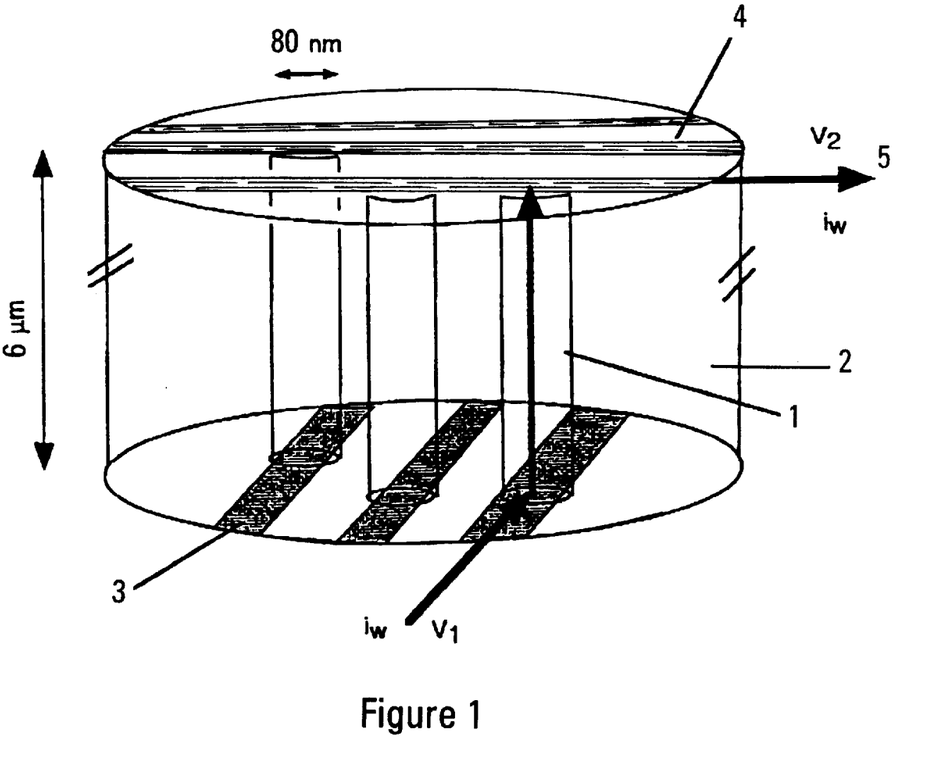
FIG. 1 is a schematic perspective view of a non-volatile random access memory storage device according to the invention, showing a section of a membrane with only three magnetoresistive memory units shown to illustrate the principle of the construction.

The memory illustrated in FIG. 1 comprises an array of magnetic sub-micron wires or dots 1 of ferromagnetic material, or Ferromagnetic/Normal-metal/Ferromagnetic multilayers, or Ferromagnetic/dielectric/Ferromagnetic junctions. The magnetic wires or dots 1 are for example nanowires obtained by electrodeposition and/or vacuum deposition and/or lithographic techniques. The diameter of each nanowire or dot is typically 10 to 200 nm and its length from about 200 to about 5000 nm.

The magnetic wires or dots 1 are embedded in a membrane 2 for example with a density up to some $5.10^8$ nanowires or dots per $cm^2$ (some Gbits/$in^2$). The membrane 2 is a structure for example of polymer such as polycarbonate or polyester, or a ceramic such as alumina or silicon oxide. The thickness of the membrane 2 corresponds to the length of the dots or wires. The membrane 2 can be flexible or rigid. The membrane 2 may overlay a structured substrate having for example one integrated circuit element (e.g. a transistor or capacitance) per memory cell, as described below with reference to FIGS. 5 and 6.

A first set or net of non-intersecting lines 3 is patterned on the bottom of the membrane 2 and another set of non-intersecting lines 4 is patterned on the top of the membrane 2. These sets of lines are applied for example by electrodeposition and/or vacuum deposition and/or lithographic techniques. The lines 3 and 4 typically have a width of about 80 to 100 nm. They are parallel and spaced apart, their spacing depending on the wire or dot diameter. For a nanowire of 80 nm diameter, the sense line spacing, from center—center, is typically about 200 nm, say from 150 to 500 nm.

Each line 3 or 4 thus contacts with the top or the bottom end of a multitude of nanowires or dots 1, along the alignment of the respective lines, as can be seen from FIG. 1 which, for simplification shows only three nanowires 1, three lines 4 and three lines 3. For simplicity, FIG. 1 shows only one of these lines 4 contacting the top of two nanowires 1.

A magnetic recording unit (not shown) is contacted by the intersection of a bottom line 3 and a top line 4 on the same wire 5. The address of each nanowire or dot 1 constituting an information unit is given by these two lines.

As described below, when the nanowires or dots 1 are grown by electrodeposition, these lines 3 serve to carry the electrodeposition current. Lines 4 serve as sensing electrodes for the in-situ monitoring technique of the electrodeposition process.

The rest of the recording unit (basic non-volatile memory cell not included) is that of silicon-based integrated circuit technology (see for example A. Cordon and LJL Fransen, "*Dynamic Semiconductor RAM Structures*", Pergamon 1984) or that of non-volatile ferroelectric random access memories NVFRAM (see for example J. F. Scott, Ferroelectric Reviews, 1 (1998) 1) or that of existing GMR memory and logical circuit propositions (see for example U.S. Pat. No. 4,722,073, and J. Shen, "*Logic Devices and Circuits Based on Giant Magnetoresistance*", IEEE Trans. Mag. 33(1997), 4492) which can be adapted to particular applications.

The structure needed for addressing the memory cell, amplifying the signal, comparing the signal to a reference signal, avoiding crosstalk, etc., is patterned on the bottom and on the top of the membrane 2 with the use of e-beam lithography, evaporation, vacuum deposition, etc.

Figure 2A:
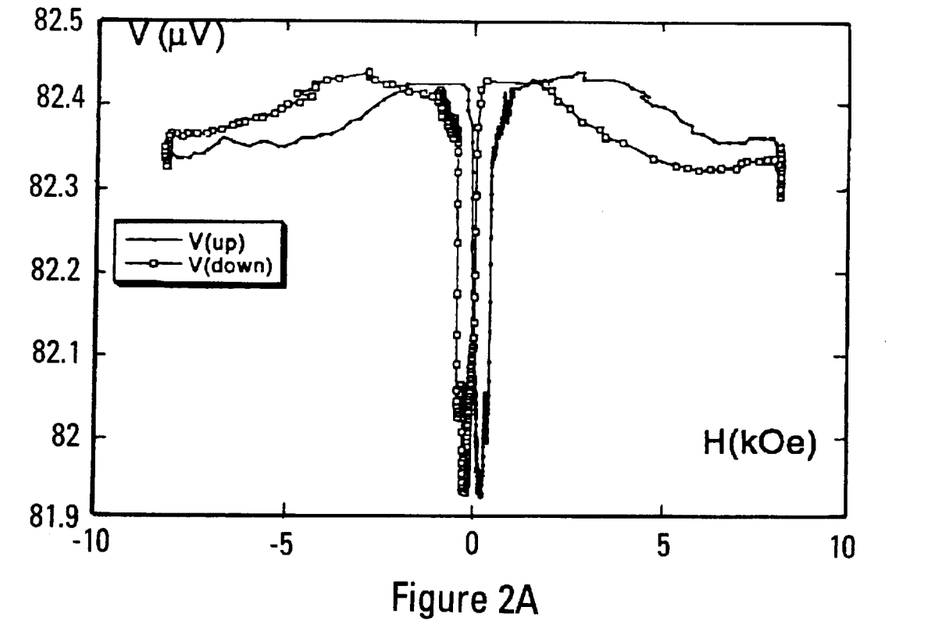
FIGS. 2A and 2B are graphs illustrating the two well-defined magnetization states of a single nanowire.
Figure 2B:
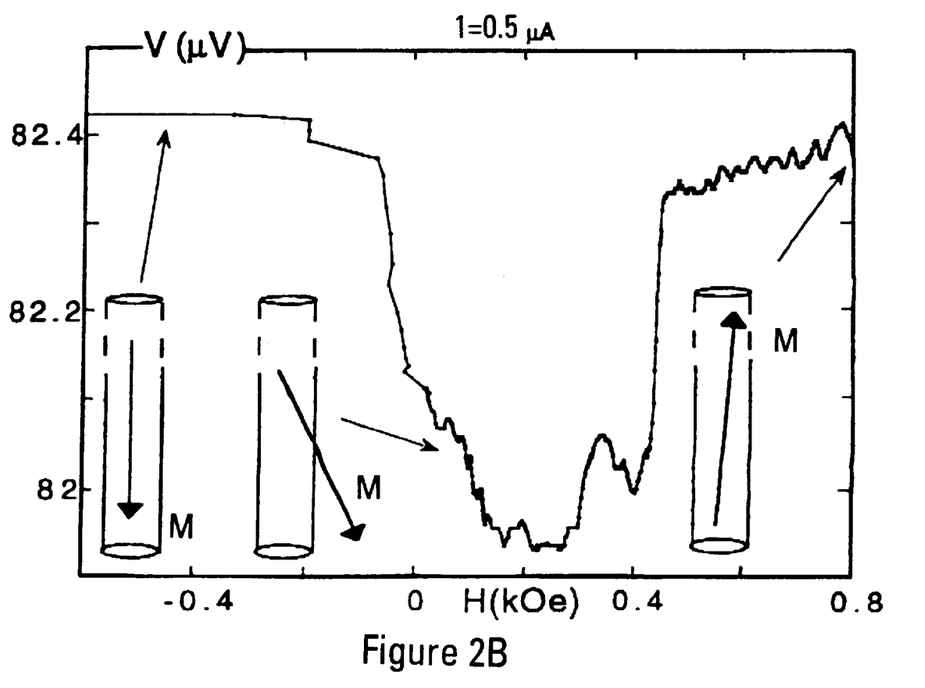

A binary information is given by two well separated states of the possible magnetic configurations of each wire or dot 1, illustrated in FIGS. 2A and 2B. FIG. 2A shows the voltage measured with a reading current $i_R$ of 0.5 $\mu A$, for the "1" and "0" states. FIG. 2B schematically illustrates the magnetization state ("0") just before the jump at the switching field $H_{sw}$=0.44 kOe, and the magnetization state ("1") just after the jump.

Such well separated states are known as a jump of the magnetization, and can be obtained and reproduced precisely from one wire or dot to the other by working with nanowires or dots of ferromagnetic metals or alloys (for further details, see for example "*Anisotropic Magnetoresistance as a Probe of Magnetization Reversal in Individual Nano-sized Nickel Wires*" J-E. Wegrowe, S. E. Gilbert, D. Kelly, B. Doudin, J.-Ph. Ansermet, IEEE Trans. Mag. 34 (1998), 903), or with structured cylindrical nanowires with Ferromagnetic/Normal-metal bilayers or Ferromagnetic/dielectric/Ferromagnetic tunnel junctions (for further details, see for example "*Magnetic and Transport Properties of Electrodeposited Nanostructured Nanowires*", B. Doudin, J. E. Wegrowe, S. E. Gilbert, V. Scarani, D. Kelly, J. P. Meier, J-Ph. Ansermet, IEEE Trans. Mag. 34 (1998), 968).

Figure 3A:
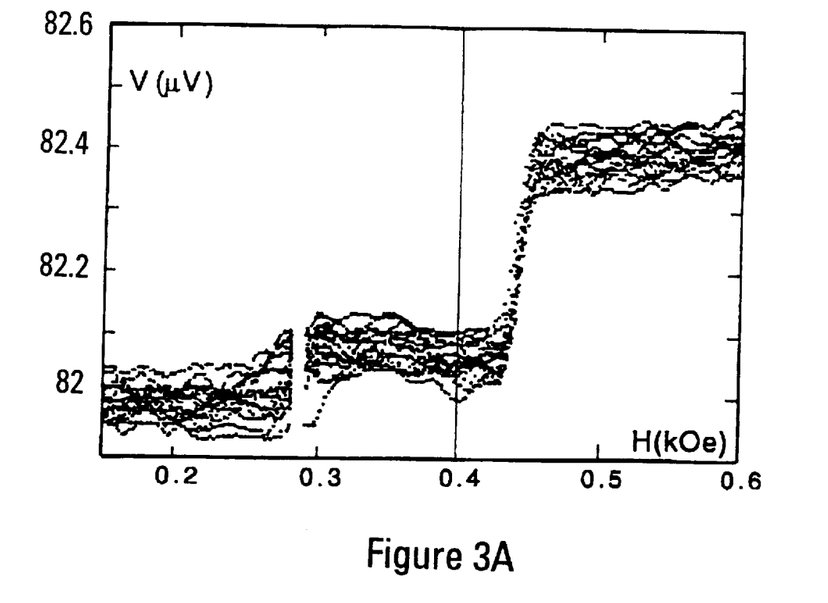
FIGS. 3A and 3B are graphs illustrating the transition between the two magnetization states.
Figure 3B:
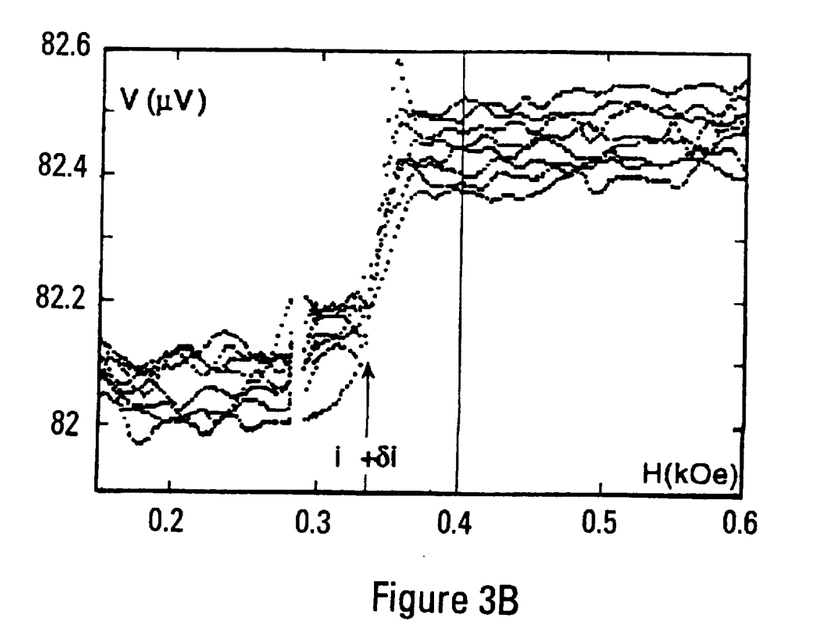

The jump from one state to the other is identified by sweeping the external magnetic field, as illustrated in FIGS. 3A and 3B. The jump occurs at the external magnetic field $H_{sw}$ known as the switching field.

Reading and Writing Processes

The reading and writing processes are illustrated in FIGS. 3A and 3B. The writing procedure at a given address is the following:

(a) The reset of the memory is performed by saturating the entire set of magnetic nanowires 1 with the external magnetic field.

(b) A pulsed current is injected in the lines 3, 4 which contact the nanowire or dot 1 to be written, or a half current pulse is injected in line 3 and a half pulse is injected in line 4. The external field is lower by an amount ΔH than the switching field Hsw. The result of the pulse is to induce the jump from the magnetic state "0" to state "1" at the external field value $H_{sw}$–ΔH.

The reading process at a given address is the following:

The magnetic state of the nanowire or dot 1 is read by injecting a current and measuring the potential between the two lines 3, 4 at a value of the external magnetic field which is comprised between $H_{sw}$–ΔH and $H_{sw}$. Due to the magnetoresistive property of the nanowire or dot 1, the value of the electric potential is shifted.

FIG. 3A illustrates reading without a pulsed current, where magnetization reversal due to the external magnetic field H from the "down" state "0" to the "up" state "1" occurs at a reading field $H_r$=440 Oe. At this reading field $H_r$=440 Oe, the magnetic state is the "0" state corresponding to the voltage 82.15 μV.

FIG. 3B illustrates writing, wherein an electric current of about 0.1 mA, pulsed over 100 ns, is added to the reading current of 0.5 μA at the external magnetic field $H_{pulse}$=340 Oe. At the reading external field $H_r$=440 Oe, the magnetic state is the state "1" corresponding to the voltage 82.40 μV. About 10 cycles are represented in the graph of FIG. 3B.

The invention will be further described in the following Examples, with reference to FIGS. 4 to 6.

EXAMPLE 1

Figure 4:
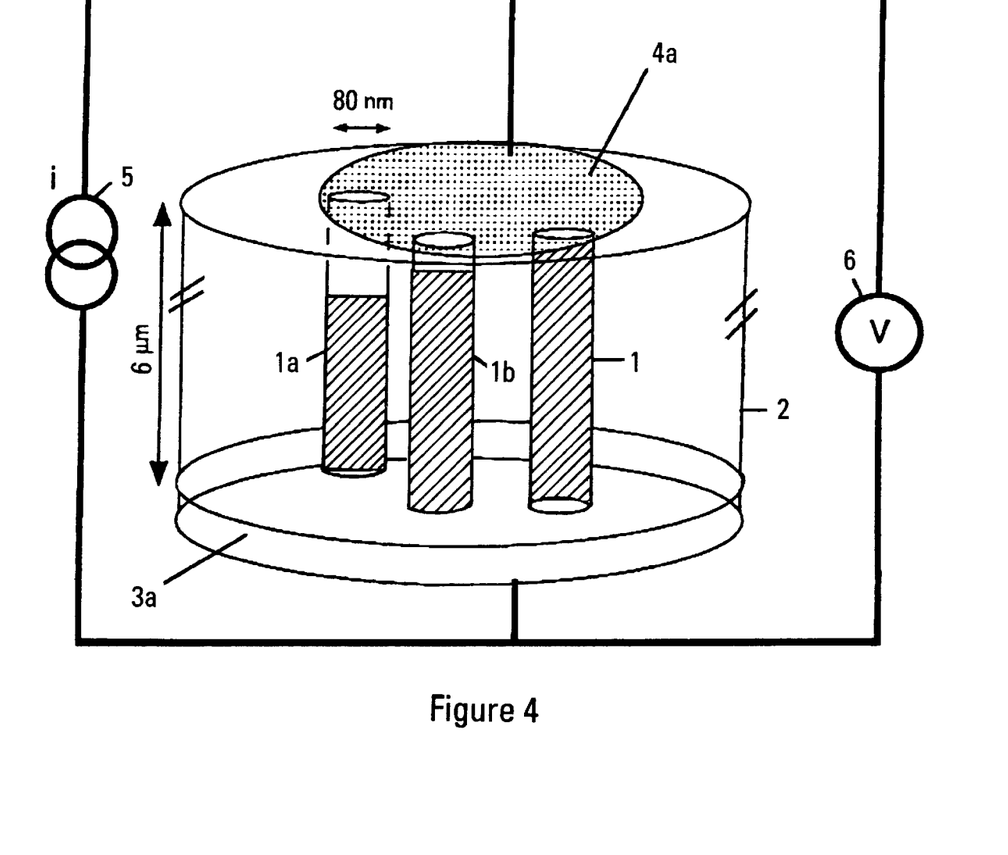
FIG. 4 schematically illustrates a set-up for producing a basic magnetoresistive memory unit according to the invention.

Basic Magnetoresistive Storage Unit (see FIG. 4)

An array of size 5 mm² composed of 10⁶ Ni nanowires 1 of diameter 80 nm, length 6 micrometer are obtained by electrodeposition in track etched polyester or polycarbonate membrane templates.

A bottom line 3a is obtained by sputtering gold on the bottom of the membrane 2. A top contact 4a is obtained by patterning a small gold contact on top of the membrane 2. A single contact is selected by an in-situ method described in detail in the aforementioned article "*Anisotropic Magnetoresistance as a Probe of Magnetization Reversal in Individual Nano-sized Nickel Wires*" J-E. Wegrowe, S. E. Gilbert, D. Kelly, B.Doudin, J.-Ph. Ansermet, *IEEE trans. Mag.* 34 (1998), 968).

Briefly, the in-situ method consists of producing a thin film gold or platinum sensing electrode 4a on the electrolyte-exposed face of the membrane 2, and attaching said electrode to a high impedance voltmeter. The common terminal of the voltmeter is isolated from ground potential, and connected to the rear electrode 3a of the membrane, and hence detects the difference in potential between the top and bottom of the membrane 2.

The unit is placed in an electroplating bath, for example a nickel plating bath. During the deposition, the metallic phase of the bottom electrode 3a is normally fixed at ground potential, and the sensing electrode 4a is allowed to float to the local electrochemical potential in the surrounding solution phase. No electrodeposition takes place on the sensing electrode 4a in the initial stages of the process. Thus the potential measured by the voltmeter 6 is the instantaneous electrochemical potential in the electrolyte plating bath at the top of membrane 2. Normally this potential is close to that of the counter electrode. As soon as a contact is established with the sensing electrode 4a by a growing metal nanowire 1, the potential between the two faces of the membrane 2 falls abruptly to a value close to zero volts.

A detection circuit to which the voltmeter 6 is connected senses the potential change and activates a relay to switch off current. By virtue of the fact that the growth rates of nanowires 1, 1a, 1b in individual pores are randomly distributed, the fastest growing nanowire 1 in a multitude of wires growing in the vicinity of the sensing electrode will make the initial contact to the sensing electrode, and trigger the relay. Typically, the resistance of the resulting nanowire 1 is about 200 Ω.

As shown in FIG. 4, when contact is made by one nanowire 1, further metal nanowires 1a and 1b growing in the pores of membrane 2, but which have not reached the sensing electrode 4a, stop growing. A single magnetic memory element will be formed by a single nanowire 1 connected by its top and bottom electrodes (or contacts) 3a, 4a to the nets of lines 3, 4 shown in FIG. 1. The remaining part-grown wires 1a, 1b included under the area of contact 4a do not constitute a functional part of the magnetic memory.

Two well separated magnetization states of the resulting magnetic memory element, shown in FIGS. 2A and 2B, account for the switch of the magnetization from a state of magnetization close to a perpendicular direction with respect to the wire 1's axis, to a state close to the "down" direction. This jump occurs at a switching field of $H_{sw}$=0.44 kOe with fluctuation of about 0.01. The potential difference $V_2$–$V_1$ jumps from 82.1 to 82.4 microVolt. The corresponding magnetoresistance ratio is about 0.35%.

Writing is performed as follows.

(a) The memory is reset to the "0" state by saturating the magnetic nanowire 1 with the external magnetic field 8 kOe.

(b) A pulsed current of about 0.1 mA is injected during about 100 nsec at a value $H_{sw}$–ΔH=0.34 kOe. The result of the pulse is to induce the jump from the magnetic state "0" to the state "1" at the external field value 0.34 kOe.

Reading is performed as follows.

By injecting an AC or DC current of 0.5 microAmp and measuring the potential at the external field H=0.4 kOe, the magnetic state "0" corresponds to V=82.1 microvolt and the magnetic state "1" corresponds to V=82.4 microvolt.

EXAMPLE 2

Figure 5A:
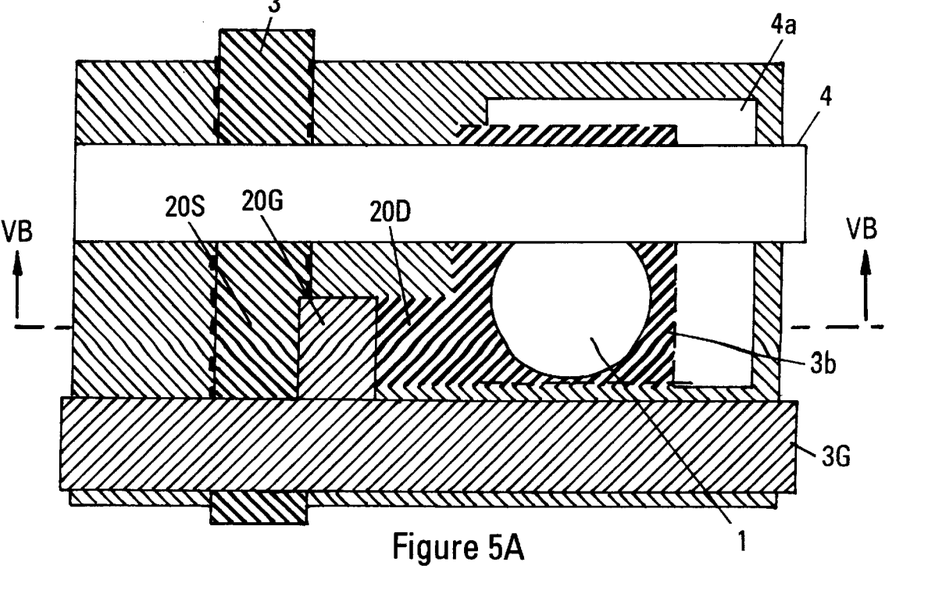
FIG. 5A is a schematic top view of a memory unit with 1-T ("one-transistor") architecture including a magnetoresistive nanowire according to the invention.
Figure 5B:
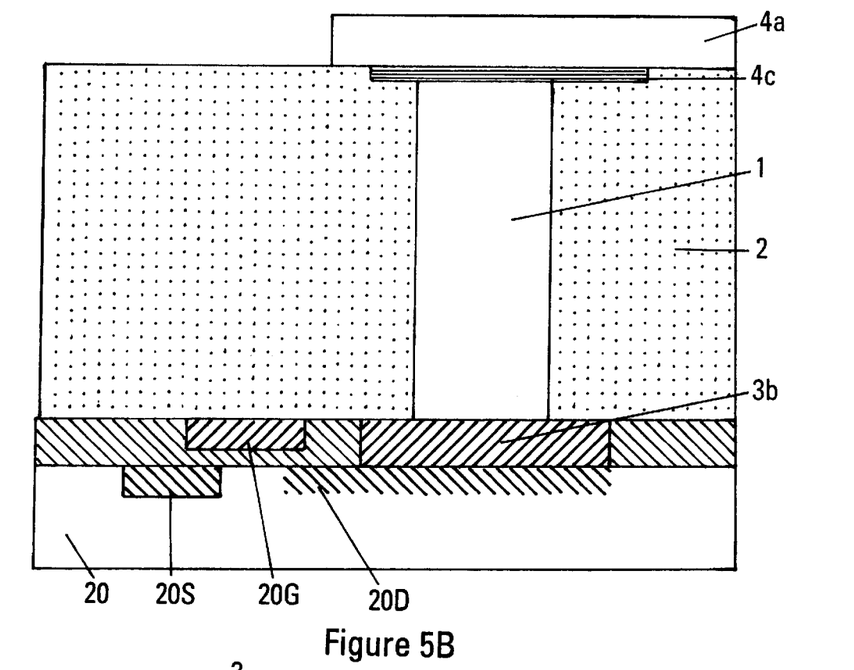
FIG. 5B is a cross-section along line VB—VB of FIG. 5A.

Architecture with a transistor contacted to the nanowire (1T architecture; see FIG. 5)

A membrane 2 embedding nanowires 1 as previously described is supported on or etched in a silicon substrate 20. The substrate 20 is e.g. P-type and the source and the drain regions 20S and 20D are formed by diffusing N-type impurities through the surfaces of the substrate 20 to form two N+ regions.

A conducting gate line 3G extends horizontally and from this gate line (not visible in FIG. 5B), a tab portion extends over the region separating source 20S and drain 20D to form a gate electrode 20G, which is separated from surfaces of wafer by a relatively thin layer of oxide.

The source 20S is a portion of a vertically-extending diffusion, which forms both the source for each of the transistors in one row of the memory and also the sense line for that row. Drain 20D is a portion of a larger diffusion which includes another rectangular section 3b forming one of the contacts of nanowire 1. The nanowire's second contact 4c on the top of membrane 2 is a deposited ferromagnetic contact which is connected to a metallic pad 4a and to the top line 4 (not visible in FIG. 5B) . This top line 4 is connected to similar electrode-forming contacts 4c for the other nanowires 1.

Figure 6:
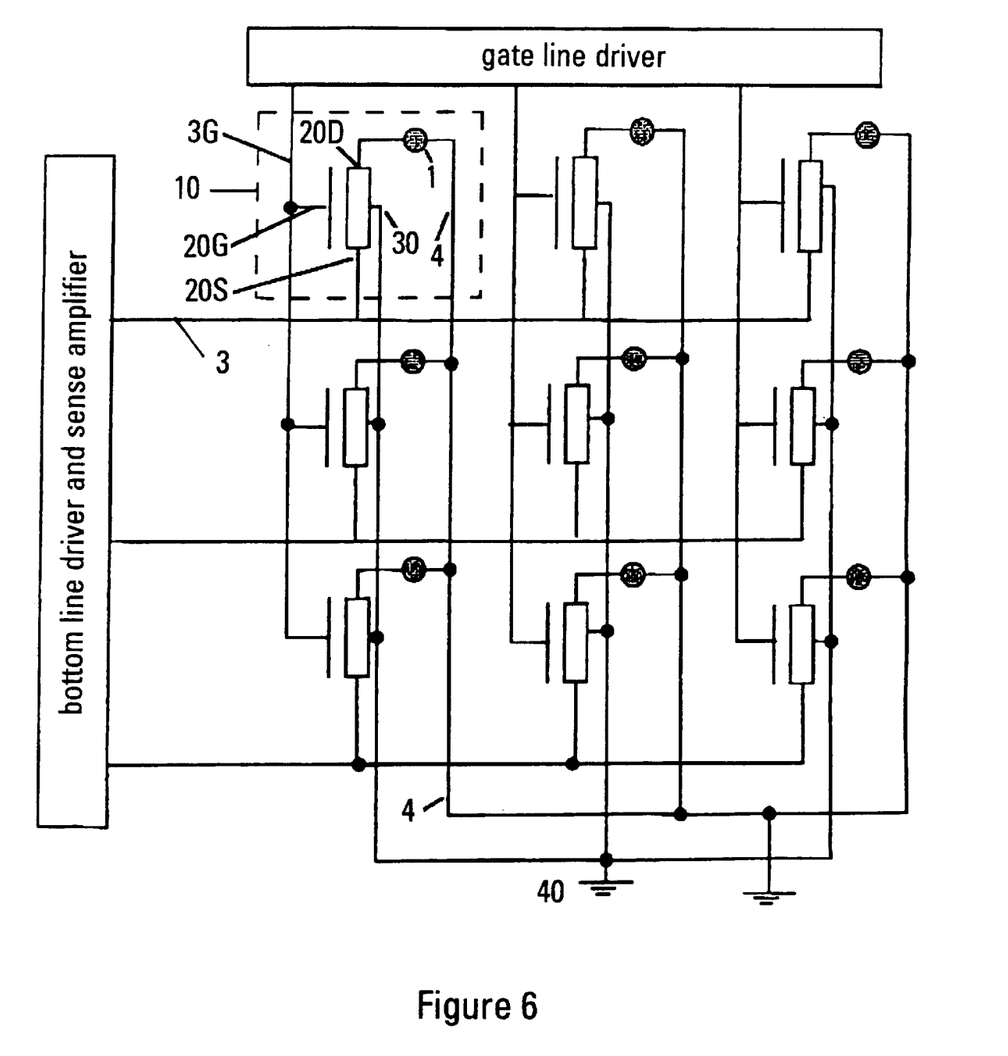
FIG. 6 is a circuit diagram of a basic memory unit according to the invention integrated in a conventional design of a 1-T MOS memory.

The role of a thus-constituted transistor in the simple example of FIG. 6 is to avoid cross-talk by current leakage when a neighbor cell in the same sense line is being written or read. The non-volatile random access memory is formed of an array of memory cells controlled for reading and writing by gate line driver (the so-called "word line driver" in semiconductor RAM literature), which are connected to the cells 10 through the same sense line 3 and the gate line 3G. The minimum number of components is achieved by designing the circuit so that one transistor, which serves as an input transistor, controls both the writing current and the reading current.

The memory is formed of an array of memory cells controlled for reading and writing by gate and sense lines, which are connected to the cells 10. During both the write and read operations, the gate line 3G which is connected to the gate electrode 20G of the MOS transistor is energized to render the transistor conductive between the source and drain 20D. Conduction occurs when the gate voltage exceeds the voltage at the source terminal by threshold voltage for the transistor. When the gate line voltage is terminated, the transistor is cut-off and presents a high impedance in the circuit. When the memory cell is not being read or written, the gate line is not energized and the cell does not contribute to the signal read by the sense line.

EXAMPLE 3

Exchange Bias or Spin-Polarization Architecture

A non-volatile random access memory of Example 1 or Example 2 has the bottom or top of its membrane covered by a magnetic layer of ferromagnetic material, as indicated at 4c in FIG. 5. This ferromagnetic layer 4c allows the two states of the memory to be controlled by the bias magnetic exchange field. This exchange bias magnetic field can be ferromagnetic or antiferromagnetic. The latter is obtained e.g. with a Gd—Co alloy sputtered layer. The advantage of this system is that, for example, the external field needed for writing can be zero and the reading field a few hundred Oersted. Alternatively, the electronic spin can be polarized by the ferromagnetic layer.

What is claimed is:

1. A non-volatile random access memory comprising a plurality of magnetoresistive memory elements connected by sets of non-intersecting conductor sense lines, the non-intersecting conductor sense lines defining the address of each memory element and being connectable to a magnetic write/read recording unit for writing and reading the magnetic state ("0", "1") of each memory element by passing current in its conductor sense lines;

wherein the memory elements are a plurality of magnetoresistive submicron dots or wires embedded in a membrane through which the submicron dots or wires extend, the sets of non-intersecting conductor sense lines being connected to the opposite ends of the submicron dots or wires on opposite sides of the membrane; each magnetoresistive submicron dot or wire being composed of ferromagnetic material or a combination of ferromagnetic and non-ferromagnetic materials having at least two magnetic states ("0"; "1"), writeable and readable absent an induced magnetic field therein by passing there through an electric current, writeable by passing a writing current pulse in its conductor lines sufficient to switch its magnetic states and readable by passing a current in its conductor lines below the level for switching its magnetic states.

2. The random access memory of claim 1, wherein the submicron dots or wires are composed of ferromagnetic material or of ferromagnetic/non-ferromagnetic metal/ferromagnetic multilayers or a ferromagnetic/dielectric/ferromagnetic junction.

3. The random access memory of claim 1, wherein the submicron dots or wires have a diameter from 10 to 100 nm and a length from 200 to 10,000 nm.

4. The random access memory of claim 1, comprising up to $10^9$ submicron dots or wires per $cm^2$ of the membrane.

5. The random access memory of claim 1, wherein the membrane is bonded to or integral with a silicon wafer substrate including integrated circuitry for processing the reading and writing currents.

6. The random access memory of claim 5, wherein the integrated circuitry comprises one integrated circuit element for each memory element comprising a submicron dot or wire.

7. The random access memory of claim 1, wherein the membrane is a track-etched polymer membrane, a porous aluminum oxide membrane, or a porous silicon oxide membrane.

8. The random access memory of claim 1, wherein a ferromagnetic or anti-ferromagnetic layer is provided on the top or bottom of the membrane in contact with the dot or wire to induce a bias exchange field for switching the memory element at weak applied field.

9. The random access memory of claim 1, wherein a ferromagnetic layer is provided on the top or bottom of the membrane and separated from the dot or wire by a thin layer of non-ferromagnetic material, to polarize the conduction electrons and amplify the action of the writing current.

10. A method of producing the random access memory of claim 1, wherein nickel or other ferromagnetic elements or alloys possessing adequate magnetoresistive characteristics are deposited into the pores of a porous membrane template using a layer of resist having a predefined pattern of apertures corresponding to the memory elements each comprising a submicron dot or wire.

11. A data storage device comprising a non-volatile random access memory according to claim 1.

12. A method of writing and reading data in a random access memory according to claim 1, wherein the writing comprises supplying current pulses to change the magnetic state of the memory elements which each comprise a submicron dot or wire, and the reading comprises passing a lower AC or DC current to determine the resistance of the memory elements.

\* \* \* \* \*